(12) United States Patent
Dadgar et al.

(10) Patent No.: US 9,406,505 B2
(45) Date of Patent: Aug. 2, 2016

(54) NITRIDE SEMICONDUCTOR COMPONENT AND PROCESS FOR ITS PRODUCTION

(75) Inventors: Armin Dadgar, Berlin (DE); Alois Krost, Berlin (DE)

(73) Assignee: ALLOS SEMICONDUCTORS GMBH, Dresden (DE)

( * ) Notice: Subject to any disclaimer, the term of this patent is extended or adjusted under 35 U.S.C. 154(b) by 372 days.

(21) Appl. No.: 11/643,632

(22) Filed: Dec. 20, 2006

(65) Prior Publication Data

US 2007/0197004 A1   Aug. 23, 2007

Related U.S. Application Data

(60) Provisional application No. 60/776,457, filed on Feb. 23, 2006.

(51) Int. Cl.
*H01L 33/00* (2010.01)
*H01L 21/02* (2006.01)

(52) U.S. Cl.
CPC ........ *H01L 21/0254* (2013.01); *H01L 21/0262* (2013.01); *H01L 21/02381* (2013.01);
(Continued)

(58) Field of Classification Search
CPC ..................... H01L 21/02458; H01L 21/0254; H01L 21/02647; H01L 21/02304; H01L 33/02; H01L 33/12
USPC ...................... 257/E33.025, E33.028, E33.03, 257/E33.033, E33.034, 94, 96, 97, 103, 257/190, 191
See application file for complete search history.

(56) References Cited

U.S. PATENT DOCUMENTS 6,582,986 B2 *   6/2003   Kong et al. .................... 438/48
6,836,498 B2 * 12/2004   Takeya et al. ............. 372/45.01
(Continued)

FOREIGN PATENT DOCUMENTS

JP   2001203386   7/2001
JP   2003-063897   3/2003
(Continued)

OTHER PUBLICATIONS

*The role of high-temperature island coalescence in the development of stresses in GaN films*; T. Böttcher et al.; Applied Physics Letters, vol. 78, No. 14, Apr. 2, 2001; 2001 American Institute of Physics (pp. 1976-1978).
(Continued)

*Primary Examiner* — Jay C Kim
(74) *Attorney, Agent, or Firm* — Ware, Fressola, Maguire & Barber

(57) ABSTRACT

A process for the production of a layer structure of a nitride semiconductor component on a silicon surface, comprising:
  provision of a substrate having a silicon surface;
  deposition of an aluminium-containing nitride nucleation layer on the silicon surface of the substrate;
  optional: deposition of an aluminium-containing nitride buffer layer on the nitride nucleation layer;
  deposition of a masking layer on the nitride nucleation layer or, if present, on the first nitride buffer layer;
  deposition of a gallium-containing first nitride semiconductor layer on the masking layer,
wherein the masking layer is deposited in such a way that, in the deposition step of the first nitride semiconductor layer, initially separate crystallites grow that coalesce above a coalescence layer thickness and occupy an average surface area of at least 0.16 $\mu m^2$ in a layer plane of the coalesced nitride semiconductor layer that is perpendicular to the growth direction.

20 Claims, 8 Drawing Sheets

(52) U.S. Cl.
CPC .... *H01L21/02458* (2013.01); *H01L 21/02505* (2013.01); *H01L 21/02639* (2013.01); *H01L 21/02647* (2013.01)

(56) References Cited

U.S. PATENT DOCUMENTS

| | | | |
|---|---|---|---|
| 6,927,426 B2* | 8/2005 | Matsuoka et al. | 257/103 |
| 2002/0190260 A1 | 12/2002 | Shen et al. | |
| 2003/0218179 A1 | 11/2003 | Koide et al. | |
| 2004/0149999 A1* | 8/2004 | Uemura et al. | 257/103 |
| 2006/0246687 A1 | 11/2006 | Kaiser et al. | |
| 2007/0045638 A1* | 3/2007 | Shen et al. | 257/94 |

FOREIGN PATENT DOCUMENTS

| | | |
|---|---|---|
| JP | 2003-318443 | 11/2003 |
| JP | 2003-536257 | 12/2003 |
| KR | 10-2000-0006299 | 1/2000 |
| WO | WO 2004/068572 | 8/2004 |
| WO | 2005/104780 | 11/2005 |

OTHER PUBLICATIONS

*Simultaneous measurement of wafer curvature and true temperature during metalorganic growth of group-III nitrides on silicon and sapphire*; A. Krost et al.; PSS (b) 242, No. 13, 2570-2574 (2005)/DOI 10.1002/pssb.200541088; 2005 Wiley-VCH Veriag GmbH & Co. KRaA, Weinheim (pp. 2571-2574).

*Low Temperature metalorganic chemical vapor deposition of InP on Si(001)*; M. Grundmann et al.; Received Sep. 4, 1990, accepted for publication Oct. 23, 1990); Appl. Phys. Lett. 58(2), Jan. 12, 1991; 1991 American Institute of Physics (pp. 284-286).

*Applications of Osprey Lightweight Controlled Expansion (CE) Alloys*; David M. Jacobson et al.; Millands, Neath SA11 INJ, UK (pp. 2-11).

*GaN-based epitaxy on silicon: stress managements*; A. Krost et al.; Phys. stat. sol. (a) 200, No. 1, 26-35 (2003)/DOI 10.1002/pssa. 200303428; 2003 Wiley-VCH Vering GmbH & Co. KGaA, Weinbeim (pp. 26-35).

*Discoloration density reduction in GaN using porous SiN interlayers*; Ashutosh Sugar et at PSS (c) z, No. z,zzz-zzz (2004)/DOI 10.1002/pssc.200400000; 2004 Wiley-VCH Verlag GmbH & Co KGaA, Weinheim.

Reduction of stress at the initial stages of GaN growth on Si(111); 2003 American Institute of Physics; Applied Physics Letter, Jan. 6, 2003, vol. 82, No. 1; A. Dadgar et al.

Bright, Crack-Free InGaN/GaN Light Emitters on Si(111); XP-002435959; phys. stat. sol. (a) 192. No. 2. 308-313 (2002); Wiley-VCH Verlag Berlin GmbH; A. Dadgar et al.

GaN-based epitaxy on silicon: stress measurements; XP-002435960; phys. stat. sol. (a) 200. No. 1. 26-35 (2003)/DOI 10.1002/pssa 200303428; Wiley-VCH Verlag Berlin GmbH; A. Krost, et al.

Thickness dependencies of optical constants for thin layers of some metals and semiconductors; XP-002435961; 2001, Institute of Semiconductor Physics, National Academy of Sciences of Ukraine; S.A. Kovalenko, et al.

* cited by examiner

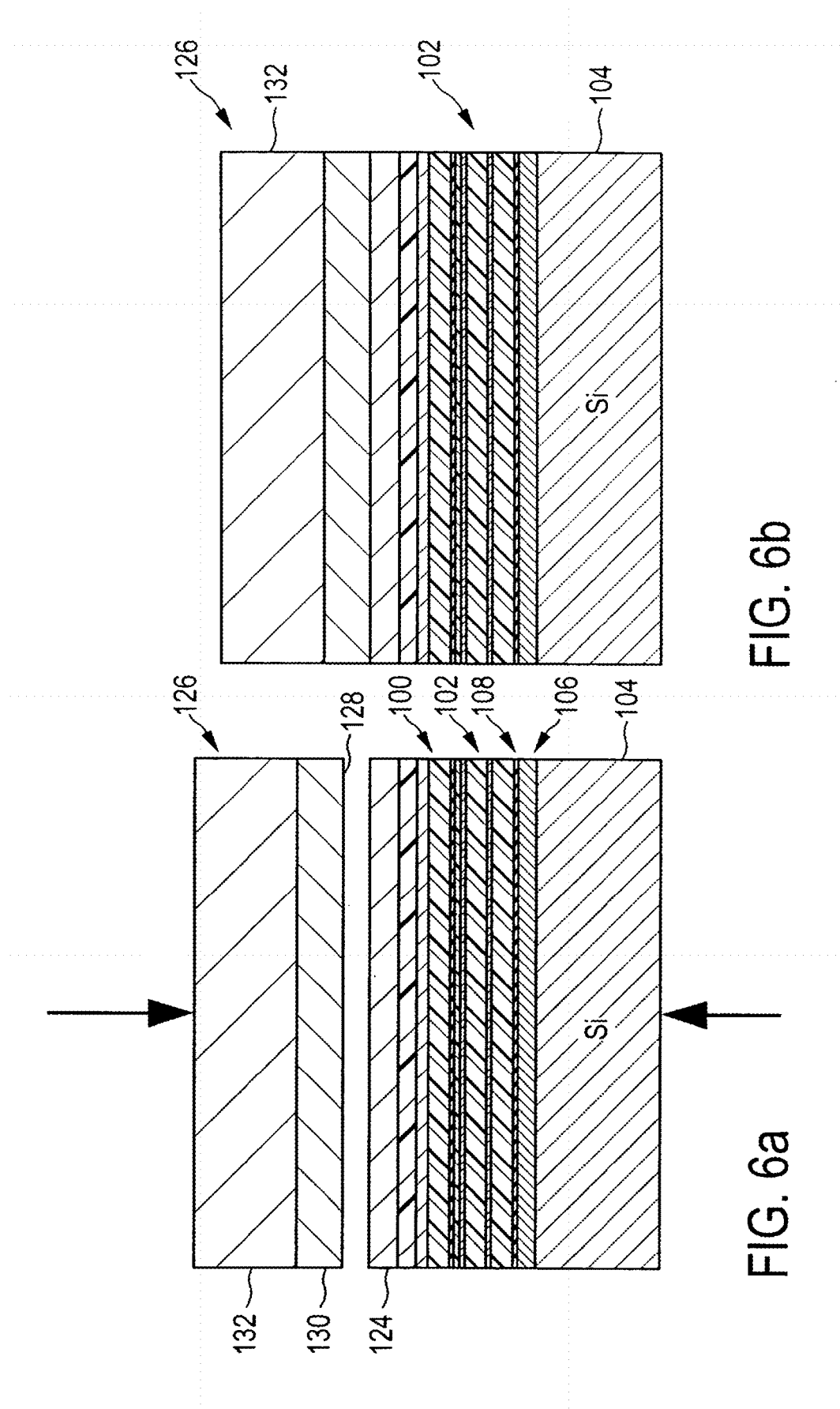

US 9,406,505 B2

NITRIDE SEMICONDUCTOR COMPONENT AND PROCESS FOR ITS PRODUCTION

CROSS REFERENCE TO RELATED APPLICATION

Reference is made to and priority claimed from U.S. provisional application Ser. No. 60/776,457 filed Feb. 23, 2006.

BACKGROUND OF THE INVENTION

1. Technical Field

The present invention relates to a process for the production of a layer structure of a nitride semiconductor component on a silicon surface. The invention also relates to a process for the production of a nitride semiconductor component. Finally, the invention relates to a nitride semiconductor component, in particular a thin film light-emitting diode (LED) based on a nitride semiconductor, as well as a nitride semiconductor product.

2. Discussion of Related Art

Nitride semiconductors are semiconductor compounds that contain one or more elements of the third main group as well as one or more elements of the fifth main group of the Periodic System. Such semiconductors include for example the semiconductors GaN, InGaN, InGaAsN, AlGaN, etc. Other common designations for nitride semiconductors within the context of the present invention are Group III nitrides and II-V nitrides. These designations are used interchangeably in the present application and have the same meaning.

Nitride semiconductors are used in particular in light-emitting structures that emit in the visible and ultraviolet regions of the spectrum. Apart from this electronic nitride semiconductor components are also known, such as for example high electron mobility (HEM) transistors, which are suitable in particular for high-frequency applications such as for example in radio transmission technology. Nitride semiconductor components are also used in the form of so-called "power devices" in high-power electronics.

On account of the very small size and poor quality of available substrates of nitride semiconductors there is at the present time little commercial interest in an inexpensive homoepitaxy of the layer structure of a nitride semiconductor component. Available nitride semiconductor components, such as for example blue or green LEDs, therefore contain layer structures that are deposited on sapphire ($Al_2O_3$) substrates or silicon carbide (SiC) substrates. These substrate materials have various disadvantages. On the one hand they are expensive. On the other hand commonly available substrates of these materials are comparatively small, so that the production costs per component are in addition increased on account of the relatively small yield for a given substrate surface. Added to this is the significant hardness of these materials, which is above 9 on Moh's scale and permits a mechanical treatment only with expensive diamond saws and grinding materials.

Silicon substrates are therefore increasingly used for a large-area growth, and as is known such substrates with a large diameter can be obtained inexpensively.

Typical growth temperatures for the layer structures of nitride semiconductors in the commercially normally employed gaseous phase epitaxy are above 1000° C. Different thermal coefficients of expansion of silicon and nitride semiconductor materials then lead during cooling of the deposited nitride semiconductor layer structures after the growth stage to a high tensile stress of the nitride semiconductor layers of about 0.7 GPa/μm and, starting with layer thicknesses of less than 1 μm, to crack formation.

In order to avoid crack formation during the growth of GaN layers on silicon, thin intermediate layers grown at unusually low temperatures (below 1000° C.), so-called low-temperature AlN or AlGaN intermediate layers, are used. The effect of these layers is based on a partial compensation of the tensile stress due to growth of a GaN layer with compressive stress on the AlN or AlGaN intermediate layer. During cooling after the layer deposition this compressive stress of the GaN layer counteracts the tensile stress produced by the different thermal coefficients of expansion, and leads as a result to a reduced tensile stress.

A disadvantage of this technique is a high dislocation concentration in the GaN layer growing on the intermediate layer. In DE 101 51 092 A1, which is hereby incorporated by reference into the disclosure of the present application, the additional insertion of silicon nitride intermediate layers into the growing GaN layer is therefore proposed in order to reduce the dislocation density. A not necessarily completely closed $Si_xN_y$ intermediate layer serves as a mask for subsequent growth of GaN. The thickness of the intermediate layer is according to DE 101 51 092 A1 chosen so that only a few growth islands spaced apart by 100 nm up to a few μm are formed on it, which during the further course of the growth, with increasing distance of the growth surface from the SiN intermediate layer have grown together starting from a so-called coalescence thickness and form a closed layer surface. Of course, only a SiN intermediate layer in the GaN epitaxy on silicon produces a pronounced island growth and thus a significant coalescence thickness, which grows with increasing SiN thickness. By suitable measures to accelerate the coalescence of these growth islands the aforementioned critical crack thickness can however already be prevented from being reached before the growth islands coalesce.

From the document by A. Dadgar et al., "Reduction of Stress at the Initial Stages of GaN Growth on Si(111)", Applied Physics Letters, Vol. 82, 2003, No. 1, pp. 28-30, (hereinafter briefly referred to as "Dadgar et al."), which is hereby incorporated by reference into the disclosure of the present application, it is furthermore known to produce GaN layers after deposition of a silicon-doped AlN nucleation layer and an SiN masking layer of at most about 1.5 monolayers nominal thickness. The tensile stress in the growing GaN layer can be reduced compared to a growth without such a SiN masking layer.

This effect exhibits, as a function of the SiN masking layer thickness, saturation phenomena starting from a certain thickness, and a complete stress compensation cannot be expected. The fact is, on the one hand the SiN masking layer can, as its thickness increases, interfere with or even prevent the structural coupling between the AlN nucleation layer and the subsequently (i.e. after the SiN masking layer) growing GaN layer. The result is that a desired compressive effect on the AlN nucleation layer may then no longer occur and an undesirably high tensile stress remains in the final nitride semiconductor layer. Secondly, a thick SiN layer increases the coalescence thickness to values that, with the known methods, can no longer be kept under the critical layer thickness for crack formation.

As a result, the insertion also of a SiN masking layer can accordingly no longer eliminate the tensile stress in the nitride semiconductor layer structure.

Non-homogeneous tensile stress has further disadvantages. Apart from the already-mentioned high dislocation concentration, it also causes a curvature of the growing layer structure and of the underlying substrate. This problem also affects thin layer components such as thin layer LEDs, in which the silicon substrate is removed during the course of manufacture. The processing of curved nitride semiconductor layer structure already cause problems and therefore increases the complexity and costs of component manufacture. A curved nitride semiconductor layer structure that is then typically bonded to a carrier easily becomes detached from the carrier, and corresponding components have an undesirably short useful life.

From the document by C. Mo et al., "Growth and characterization of InGaN blue LED structure on Si(111) by MOCVD", Journal of Crystal Growth, 285 (2005), 312-317 (hereinafter briefly referred to as "Mo et al."), which is hereby incorporated by reference into the disclosure of the present application, it is known to reduce the tensile stress by growing a GaN buffer layer on the AlN nucleation layer. In this case a very low ratio of the gas flow densities of gallium precursor to nitrogen precursor are adjusted for the growth of the GaN buffer layer in the high-temperature gaseous phase epitaxy. This promotes the island growth of the subsequent GaN layer. The disadvantage here however is that tensile stresses still remain in the nitride semiconductor layer structure. In addition this known LED has an undesirably high electrical resistance.

The technical problem on which the present invention is based is accordingly to provide a process for the production of a layer structure of a nitride semiconductor component on a silicon surface and a nitride semiconductor component itself, in which the tensile stress in the finished layer structure is further reduced compared to known solutions to this problem.

A further technical problem on which the present invention is based is to provide a process for the production of a layer structure of a nitride semiconductor component on a silicon surface and a nitride semiconductor component itself that reduces the curvature of the nitride semiconductor layer structure compared with known solutions to this problem.

DISCLOSURE OF INVENTION

According to a first aspect of the invention the aforementioned technical problems are solved by a process for the production of a layer structure of a nitride semiconductor component on a silicon surface, comprising the following steps:
provision of a substrate that has a silicon surface;
deposition of an aluminium-containing nitride nucleation layer on the silicon surface of the substrate;
optional: deposition of an aluminium-containing nitride buffer layer on the nitride nucleation layer;
deposition of a masking layer on the nitride nucleation layer or, where present, on the first nitride buffer layer;
deposition of a gallium-containing first nitride semiconductor layer on the masking layer,
wherein the masking layer is deposited in such a way that, in the deposition step of the first nitride semiconductor layer, separate crystallites first of all grow that coalesce above a coalescence layer thickness and occupy an average surface area of at least 0.16 $\mu m^2$ in a layer plane of the coalesced nitride semiconductor layer that is perpendicular to the growth direction.

With the process according to the invention it has surprisingly been found that it is possible to generate during the growth of the first nitride semiconductor layer an increased compressive stress therein, which with a suitable further processing can even effect a complete or almost complete compensation of the tensile stress that is produced by the different thermal coefficients of expansion. A layer structure can be grown that, after cooling at room temperature, is either completely stress-free, or is virtually stress-free with a value that is in any case significantly less than 0.2 GPa/µm, as a rule however even less than 0.1 GPa/µm, and that moreover has only a very low dislocation concentration and exhibits only very few cracks or indeed no cracks at all.

The process according to the invention is at the same time suitable for the production of layer structures with a particularly high or even an infinite radius of curvature, which is of great advantage in particular in the production of thin film components such as LEDs.

In this way an inexpensive growth of thin film components based on nitride semiconductors is also possible on large format silicon wafers or SOI (silicon-on-insulator) wafers.

These advantages can presumably be attributed to the fact that the intergrowing crystallites above a suitably deposited masking layer, preferably consisting of SiN, produce, due to their coalescence, a sufficiently strong compressive stress during their growth and attainment of an average crystallite surface area of 0.16 $\mu m^2$ and more in the nitride semiconductor layer. This relatively strong compressive stress can better compensate the later, still unknown tensile stress that will be produced.

The average crystallite surface area of the crystallites in a layer plane above the coalescence layer thickness in a nitride semiconductor layer can be determined by means of an image-assisted analysis process, such as for example an analysis of plan view transmission electron microscope (TEM) images, as will be explained in more detail hereinbelow with the aid of two examples. The analysis should obviously be based on a sufficiently large random sample of crystallites.

It could not have been expected from the prior art, on the basis of the observed saturation effects described above when using an SiN masking layer (Dadgar et al.) and the only partial stress reduction, likewise described above, that when using a GaN buffer layer (Mo et al.) this effect and the possibility of an almost complete stress compensation would occur. This surprising effect is utilised according to the present invention for the production of in particular slightly stressed or completely unstressed nitride semiconductor layer structures on a silicon surface, from which particularly advantageous nitride semiconductor components can subsequently be produced.

An aluminium-containing nitride layer with a respective function (nucleation layer, buffer layer, intermediate layer, etc.) as used here is to be understood to mean a layer having the respective function that contains aluminium either as the sole Group III metal or in combination with other Group III metals. Doping with elements of other groups of the Periodic System, such as with silicon or magnesium, is disregarded for the purposes of the definition. Obviously however such doping substances may also be included.

A nucleation layer is only a few nanometers thick and is not necessarily a closed layer, but despite possibly poor crystalline and/or stoichiometric properties forms a basis for a subsequent layer growth of the layer growing thereon, or from which a further layer growth starts.

A masking layer serves for the complete or partial covering of a surface and is often only a few monolayers or even less than one monolayer thick.

A second aspect of the present invention relates to a process for the production of a nitride semiconductor component, comprising the following steps:
production of a layer structure of a nitride semiconductor component on a silicon surface according to a process according to the first aspect of the invention or according to one of the embodiments described hereinafter in this application;

bonding of the layer structure to a carrier in such a way that the growth upper side of the layer structure is facing the carrier;

removal of the substrate;

production of a contact structure.

The process according to the second aspect of the invention is an advantageous development of the process of the first aspect of the invention and permits a particularly simple and inexpensive processing of nitride semiconductor components.

According to a third aspect of the invention the technical problems mentioned above are solved by a nitride semiconductor component with a gallium-containing first nitride semiconductor layer that has a structure of intergrowing crystallites that occupy an average surface area of at least $0.16$ $\mu m^2$ in a layer plane perpendicular to the growth direction, an aluminium-containing nitride intermediate layer that adjoins the first nitride semiconductor layer, and adjoining the last layer, a gallium-containing further, second nitride semiconductor layer.

Such components, which comprise a structure of the nitride semiconductor layer that is characteristic of the production on a silicon surface, have a long service life and favourable operating parameters that are essential for commercial applications, combined with low production costs.

The nitride semiconductor component of the third aspect of the invention has structural features that are characteristic of the process procedure according to the invention and enable a nitride semiconductor component produced by this process to be distinguished from other nitride semiconductor components.

Thus, it is of course in principle also possible and known per se to produce crystallites with a large average surface area using a sapphire substrate. However, nitride semiconductor components produced on a sapphire substrate and that contain no AlGaN layers more than 100 nm thick do not have any aluminium-containing nitride semiconductor intermediate layers, in particular do not have any aluminium nitride intermediate layers. The growth of semiconductor layers on a sapphire substrate is subject to completely different boundary conditions than growth on a silicon substrate, as is described in the present invention. The fact is, layer growth on a sapphire substrate always leads to a biaxially compressively stressed layer after cooling. A strain engineering with the aid of aluminium-containing nitride intermediate layers that leads to a compressive stress of the GaN layers during the growth is not necessary and in fact is even undesirable in LED structures, since it leads to a very marked substrate curvature during the growth of the InGaN layer around 800° C. and at the end of the process. As explained in the introduction, it is also known per se in the growth of nitride semiconductor layers on silicon to employ aluminium-containing nitride semiconductor intermediate layers for the strain engineering.

However, a combination of these two features was hitherto not technically achievable. Only under the process procedure according to the first aspect of the present invention has it become possible to produce layers with crystallites of a sufficiently large surface area on a silicon substrate. During continued growth of these nitride semiconductor layers for the production of thicker nitride semiconductor layers of more than about 1300 nm in thickness, strain engineering intermediate layers are necessary only for the growth based on a substrate with a silicon surface, in order thereby to establish a sufficiently large compressive stress during the growth that can completely or almost completely compensate a tensile stress that then arises during the subsequent cooling. In specialist circles it was hitherto not been possible to produce a nitride semiconductor component according to the present third aspect of the invention.

The layers first produced in the deposition on the silicon surface, namely the aluminium-containing nitride nucleation layer and the masking layer, are within the framework of the further processing typically removed from the silicon surface after the stripping of the grown layers, for a production of thin film components such as thin film LEDs. Accordingly nitride semiconductor components can be produced by the process according to the invention, and although the process procedure according to the invention cannot demonstrate the existence of the nucleation and masking layers, nevertheless the presence of aluminium-containing nitride semiconductor intermediate layers in the layer structures provides a clear indication to use a silicon substrate in the growth.

According to a fourth aspect of the invention the technical problems mentioned above are solved by a nitride semiconductor product with a substrate that has a silicon surface, an aluminium-containing nitride nucleation layer adjoining the silicon surface, optional: an aluminium-containing nitride buffer layer adjoining the nitride nucleation layer, a masking layer on the nitride nucleation layer or, if present, on the nitride buffer layer, and with a gallium-containing first nitride semiconductor layer arranged adjoining the masking layer and having a structure of coalesced crystallites, in which the crystallites above a coalescence layer thickness and in a layer plane perpendicular to the growth direction occupy an average surface area of at least $0.16$ $\mu m^2$.

The nitride semiconductor product of the invention is typically an independently obtainable intermediate product of the component manufacture. It may be used to produce components both on the existing substrate with a silicon surface, as well as, after stripping of the substrate, on another carrier, or may be used for the production of large area unsupported layers, large area nitride semiconductor substrates, or unsupported components.

Embodiments of the various process and device aspects of the present invention are described hereinafter. The embodiments may be combined with one another, unless this is explicitly excluded.

Embodiments of the process for the production of a layer structure of a nitride semiconductor component on a silicon surface according to the first aspect of the invention will first of all be described.

The layer quality is improved with particularly large crystallite surfaces. In a preferred embodiment the masking layer is therefore deposited in such a way that separate crystallites first of all grow in the deposition step of the first nitride semiconductor layer, which crystallites coalesce above a coalescence layer thickness and occupy an average surface area of at least $0.36$ $\mu m^2$ in a layer plane of the coalescing nitride semiconductor layer perpendicular to the growth direction.

In a further embodiment the masking layer is deposited in a layer thickness that, in the case of the first nitride semiconductor layer first of all growing in the form of growth islands, starting at a distance of at least 600 nm from the masking layer enables a layer surface that is at least 80% closed to be formed. The process procedure of this embodiment has, with a good reproducibility, led in investigations to gallium-containing nitride semiconductor layers which have largely coalesced above a layer thickness of 600 nm and that in layer planes above this distance from the nucleation layer exhibit large area crystallites whose average surface area is above 0.16 µm².

In the process procedure according to the invention and in particular in the process procedure in the embodiment just described above, there is preferably used as starting point a masking layer that provides a coverage of the underlying nitride nucleation layer or, where present, of the first nitride buffer layer, of at least 95%. With this degree of coverage relatively few growth nuclei are formed above the masking layer that can develop to form large crystallites by a three-dimensional growth (island growth) during the course of the further layer deposition.

The best results have been obtained hitherto with masking layers of silicon nitride. In principle it is however also conceivable to use other suitable materials for the masking layer, such as for example anti-surfactants, which thus prevent a wetting of the nucleation layer. In this case, in principle for example all metal nitrides that are used at the high growth temperatures of the nitride semiconductor deposition might be suitable. Substances that grow amorphously are however more likely to be suitable since often no nucleation or only a delayed nucleation occurs on such surfaces.

The process procedure is accompanied in a preferred embodiment by a concomitant measurement of the reflection intensity of the growth surface (reflectometry). This process known per se for monitoring the layer growth permits a control and defined adjustment of the duration of the deposition of the masking layer, which is preferably chosen so that in the deposition step of the first nitride semiconductor layer the concomitant measurement of the reflection intensity of the growth surface at a light wavelength of ca. 600 nm exhibits an oscillating intensity behaviour with increasing oscillation amplitude, which at the earliest after five oscillation cycles then reaches a roughly constant maximum value. The exact value of the duration of the deposition of the masking layer depends on numerous parameters, which can vary from one growth reactor to another. Using the experience of the present embodiment a suitable duration of the deposition of the masking layer can be determined for a respective growth reactor by means of a few experiments.

The first nitride semiconductor layer already grows in accordance with the process according to the invention with compressive stress. Preferably, none of the growth parameters (such as for example an increased growth temperature or a high V/III ratio) promoting coalescence are adjusted. Under these conditions a particularly compressive layer growth is obtained, and thereby a reduced tensile stress after cooling and thus a homogeneously stressed or unstressed nitride semiconductor layer structure can be produced.

If a nitride semiconductor is to be deposited in a greater layer thickness, the first nitride semiconductor layer is preferably deposited in a layer thickness of 800-1600 nm, before further layers are grown as explained hereinafter, which lead to the higher layer thickness. Preferably in this case an aluminium-containing nitride intermediate layer is in fact deposited on the first nitride semiconductor layer and then a gallium-containing further nitride semiconductor layer is deposited on the last layer, which is also termed the second nitride semiconductor layer. With the aluminium-containing nitride intermediate layer, which in the case of the growth of GaN as first nitride semiconductor layer is preferably a low-temperature AlN layer, the compressive stress in the layer structure can be raised still further. The function of the aluminium-containing nitride intermediate layer is thus strain engineering.

The sequence of the deposition of an aluminium-containing nitride intermediate layer and a gallium-containing further nitride semiconductor layer may be carried out repeatedly. In this way the first nitride semiconductor layer can be followed by a second, third, fourth, etc. nitride semiconductor layer, in each case with previously deposited aluminium-containing intermediate layers. This produces, apart from the nitride intermediate layers, a thick nitride semiconductor layer that is composed of the first, second, possibly third, etc. nitride semiconductor layer. If necessary further intermediate layers with other functions can obviously be incorporated herein.

The thickness of the aluminium-containing nitride intermediate layer is for example 8 to 15 nm in the case where a low-temperature AlN intermediate layer is employed. The use of an AlGaN intermediate layer is also conceivable, in which case roughly the same layer thicknesses are suitable. The use of thicker AlN intermediate layers grown at high temperatures for strain engineering purposes is known from DE 10 2004 038 573 A1, in the name of the applicants. It should be noted in this case that it is found from experience that, starting from a thickness of this layer of ca. 30 nm, there is a tendency towards the formation of a high electrical resistance layer structure, which is disadvantage for the production of light emitters. Also, there is an increased tendency towards crack formation.

If the use of aluminium-containing nitride intermediate layers is dispensed with, the first nitride semiconductor layer is preferably deposited in a thickness of 1300 nm (in the case of GaN). Above this layer thickness cracks may occur on cooling on account of the tensile stress component that then arises.

For the production of light-emitting nitride semiconductor components a multi-quantum-well structure of nitride semiconductor material is preferably deposited on the second or, according to the process procedure with a repeated layer deposition as explained above, on another further nitride semiconductor layer. Multi-quantum-well structures for light-emitting nitride semiconductor components are known per se and do not need to be described in more detail here.

It has been found that the deposition of at least a second masking layer of silicon immediately before the deposition of those of the further nitride semiconductor layers on which the multi-quantum-well structure is deposited, produces a particularly good layer quality in the region of the layer structure that is decisive for the light emission.

To produce an optoelectronic component an n-doping is preferably incorporated in the first and, where present, those further nitride semiconductor layers that are deposited before the multi-quantum-well structure. In order to produce a p-doped zone a p-doped gallium-containing nitride semiconductor cover layer is preferably deposited on the multi-quantum-well structure.

In particular for the growth of thick layer structures, the problem has to be taken into account that a stress occurring in the nitride semiconductor layer structure will also act on the substrate and can lead to a substrate curvature. Such a curvature is also known from other heterosubstrates, such as for example sapphire. The reduction of this curvature includes in a preferred embodiment the step of providing a substrate, in particular a conductive silicon substrate whose thickness is at least $D_{GaN} \times x$, where $D_{GaN}$ denotes the layer thickness of the nitride semiconductor layer to be deposited on the substrate or, if more than one nitride semiconductor layer is to be deposited, the sum of the layer thicknesses of the nitride semiconductor layers to be deposited on the substrate and of the existing nitride intermediate layer, and where x in the case when a doped silicon substrate is used is at least 110, and in the case where an undoped substrate is used is at least 200. With these values of the layer thickness the possible plastic deformation due to the compressive pre-stress in the Si substrate can in each case be successfully prevented. This is advantageous since a crystal deformed in this way might no longer be planar.

This additional feature of the present embodiment represents a concept of the invention that is independently worthy of protection. A process that is independently worthy of protection for the production of a layer structure of a nitride semiconductor component on a silicon surface accordingly includes the step of providing a silicon substrate corresponding to the additional feature of the last-mentioned embodiment. The further steps of the process of the first aspect of the invention as well as the embodiments of the process of the first aspect of the invention that are described here form embodiments of this process that is independently worthy of protection. Specifically in the case of relatively highly stressed layer structures the process of this independent invention can prevent the silicon substrate developing too great a curvature.

The aforedescribed embodiment is further improved if the silicon substrate has a thickness that in addition is greater than or equal to $100 \times \sqrt{D_{GaN}} \times y$, where $$y = \frac{\text{Substrate diameter in cm}}{3.5}.$$

This additional condition is advantageous in particular in LEDs with InGaN or AlGaN layers.

Embodiments of the process according to the second aspect of the invention, which relates to the production of a nitride semiconductor component, are described hereinafter. This process includes all the steps of the process of the first aspect of the invention and thus also shares its advantages.

In a preferred embodiment of this process according to the second aspect of the invention an electrically conducting contact layer is deposited on the growth upper side of the layer structure produced by the process according to the first aspect of the invention.

In a first of two alternative embodiments described hereinafter, the contact layer has a higher refractive index than the p-doped nitride semiconductor cover layer. The contact layer may in addition be metallised, just like the growth upper side of the nitride semiconductor layer structure, if no contact layer is present. In this way the light yield of the nitride semiconductor component is increased. In this first alternative embodiment with a contact layer whose refractive index is greater than that of the p-doped nitride semiconductor cover layer, this nitride semiconductor cover layer is preferably deposited in a thickness of $$m \cdot \frac{\lambda}{2 \cdot n_{nitride}} + \frac{\lambda}{4 \cdot n_{nitride}} - \frac{d_{MQW}}{2},$$

where m=0, 1, 2, 3, . . . ; λ is a wavelength of a light emission of the multi-quantum-well structure during operation of the nitride semiconductor component, $n_{nitride}$ is the refractive index of the nitride at the wavelength λ, and $d_{MQW}$ denotes the thickness of the multi-quantum-well structure. This increases the light yield it the nitride semiconductor cover layer in the finished component is embedded in the material with n>n (nitride). These include metals or higher refractive index materials, for example higher refractive index semiconductors.

In the second of the two alternative embodiments the contact layer has a smaller refractive index than the p-doped nitride semiconductor cover layer. In this embodiment the nitride semiconductor cover layer is preferably deposited in a thickness of $$m \cdot \frac{\lambda}{2 \cdot n_{nitride}} - \frac{d_{MQW}}{2},$$

where m=1, 2, 3, 4, . . . ; λ is a wavelength of a light emission of the multi-quantum-well structure in the operation of the nitride semiconductor component, $n_{nitride}$ denotes the refractive index of the nitride at the wavelength λ, and $d_{MQW}$ denotes the thickness of the multi-quantum-well structure. This formula applies to the case where the nitride semiconductor cover layer is covered with a material of smaller refractive index, such as e.g. various plastics materials, air, etc. This is the more usual case with standard LEDs, but not however with stripped LEDs.

It has proved particularly advantageous to employ a carrier whose surface that is used for the bonding is electrically conducting, reflecting or metallic. As is known, most metals combine these properties in an advantageous manner. In this way the heat dissipation from the component is improved. Preferably the metallic surface or the whole carrier is formed of copper, aluminium, aluminium nitride, silicon or aluminium-silicon and/or aluminium-silicon-carbon.

A particularly suitable other carrier material is aluminium-silicon (Al/Si) with a high silicon content, ideally above at least 70%, which is an electrically and thermally highly conducting compound with, apart from copper or aluminium, virtually identical coefficients of expansion compared to GaN, and with a higher Si content has even identical coefficients of expansion. This prevents problems in the installation and operation of the LEDs, since the stresses that occur in this connection can lead to the separation or stripping of the component or to cracks in the layer. At the present time LEDs are therefore for example bonded to Al carriers with elastic adhesives, since only in this way can the widely varying thermal coefficients of expansion (GaN ~5.6 ppmK$^{-1}$, Al>20 ppmK$^{-1}$) be controlled. The use of elastic adhesives has disadvantages however. A further invention independently worthy of protection is accordingly the use of an Al/Si carrier for the production of a light-emitting thin-film nitride semiconductor component, as well as a light-emitting thin film nitride semiconductor component with an Al/Si carrier as such, in which the composition of the Al/Si carrier is according to the invention chosen so that it has a thermal coefficient of expansion that is identical or almost identical to that of the nitride semiconductor material of the component. The disadvantages of elastic adhesives may be completely avoided with an Al/Si carrier (coefficient of expansion of AlSi(30/70) of for example 7.5 ppmK$^{-1}$). The thermal conductivity of this carrier material is still half as good as that of aluminium and is therefore more than an order of magnitude better than that of Si.

The bonding is preferably carried out at low temperatures, which lie in a range between 280 and 500° C. At the present time a temperature of 280° C. is particularly preferred. In this way no or only slight additional stresses are produced during cooling after the bonding. The metal is not liquid below 280° C. A temperature of 500° C. is already towards the critical upper limit for many carriers on account of possibly occurring stress, though such a temperature may still be feasible for other carriers. At temperatures higher than 500° C. the contact metal may also seriously suffer, depending on the material that is used.

The removal of the substrate in the process of the second aspect of the present invention is preferably carried out by abrasion. In addition wet chemical or dry chemical etching may be employed.

In a further embodiment the growth rear side exposed by removal of the substrate is structured so as to form an anti-reflective layer. This may be carried out very easily for example by etching the N face, i.e. the nitrogen face (000-1) of the material, with KOH (potassium hydroxide), and with a suitable process procedure provides highly suitable structures that are somewhat pyramidal in shape.

According to an alternative process procedure, which also forms a fourth invention independently worthy of protection, the substrate is not completely thinned and then oxidised by the described process procedure according to the second aspect of the invention or of one of its embodiments, but is thinned and then oxidised to a residual layer thickness of 3-10 µm. The silicon oxide layer that is thereby formed is roughly structured as a transparent layer. The process thus comprises the following steps production of a layer structure of a nitride semiconductor component on a silicon surface;

bonding of the layer structure to a carrier in such a way that the growth upper side of the layer structure is facing the carrier;

removal of the substrate down to a thin silicon layer that is preferably 5 to 10 µm thick;

oxidation of the silicon layer to form a silicon dioxide layer;

production of a contact structure.

This process procedure has the advantage that it can be used for an improved light decoupling. Apart from this the oxidation of the silicon substrate produces an elongation of the former substrate and thus as a result produces a slightly compressive stress of the nitride semiconductor (for example GaN) layer. This is particularly advantageous if this GaN layer is subjected to a slight tensile stress. Due to the compressive stress a cracking and bending of the GaN layer is thus reliably avoided. The thicker layer stack due to the oxidised Si substrate still remaining, with thicknesses in the range from 6-20 µm, has in particular a higher mechanical strength, which simplifies the production of the components.

Embodiments of the nitride semiconductor component according to the invention in accordance with the third aspect of the invention are described hereinafter, insofar as they do not already follow directly from the embodiments described above of the process according to the invention. Preferably the nitride semiconductor component contains a carrier of the nitride semiconductor layer structure that is different from the substrate on which the layer structure was grown. A particularly suitable carrier basically consists of copper, aluminium or Al/Si. In this way the dissipation of heat that is produced in the operation of the nitride semiconductor component is improved.

Embodiments with p-doped and n-doped regions, such as are usual in light-emitting semiconductor components (LEDs, laser diodes), but also in electronic components (transistors, etc.), are provided in a preferred embodiment with in each case an electrical contact element.

A further preferred embodiment contains at least one further masking layer of silicon nitride arranged immediately adjacent to that of the further nitride semiconductor layers on which the multi-quantum-well structure is deposited, though on the side of this further nitride semiconductor layer that faces away from the multi-quantum-well structure. In this way the layer quality is improved in the region of the component that lies closest to the multi-quantum-well structure and accordingly has a great influence on the charge carrier operating life. By improving the layer quality a longer charge carrier operating life can be achieved, which is attributed to the suppression of undesired recombination at defects.

An intermediate product that is formed in the production of the nitride semiconductor component according to the invention is a carrier wafer on which a large number of nitride semiconductor components according to the invention are arranged. The carrier wafer forms an intermediate product that is comparable to a processed wafer in silicon technology. The separation of the nitride semiconductor components arranged on the carrier wafer can be carried out by the manufacturer of the processed carrier wafer itself, or can take place after transportation to a component manufacturer.

The advantage of the invention in this aspect is that particularly large carrier wafers can be used, since the process according to the invention can be carried out on large, commercially widely used silicon wafers. After removing the nitride semiconductor layer structure that has grown on the silicon wafer, the said structure can be bonded to a carrier wafer of corresponding size. The invention thus permits a particularly inexpensive production of components. The nitride semiconductor components in their totality may have for example a lateral dimension of at least 24 cm on the carrier.

Embodiments of the nitride semiconductor product according to the fourth aspect of the invention are described hereinafter, insofar as they do not follow directly from the previously described embodiments of the other aspects of the invention.

In a preferred embodiment the nitride semiconductor product has a curvature, measurable on the substrate in a direction perpendicular to the rear side substrate surface, that corresponds to a radius of curvature of at least 10 m or to an infinitely large radius of curvature. Such large radii of curvature are possible with the process procedures according to the invention if, due to the insertion of low-temperature strain engineering intermediate layers, a sufficiently high compressive stress is generated during the growth that is compensated as closely as possible in the subsequent cooling, due to the tensile stress that is then produced.

BRIEF DESCRIPTION OF THE DRAWINGS

Further embodiments and advantages of the invention follow from the following description of the accompanying figures, in which.

DETAILED DESCRIPTION

Figure 1:
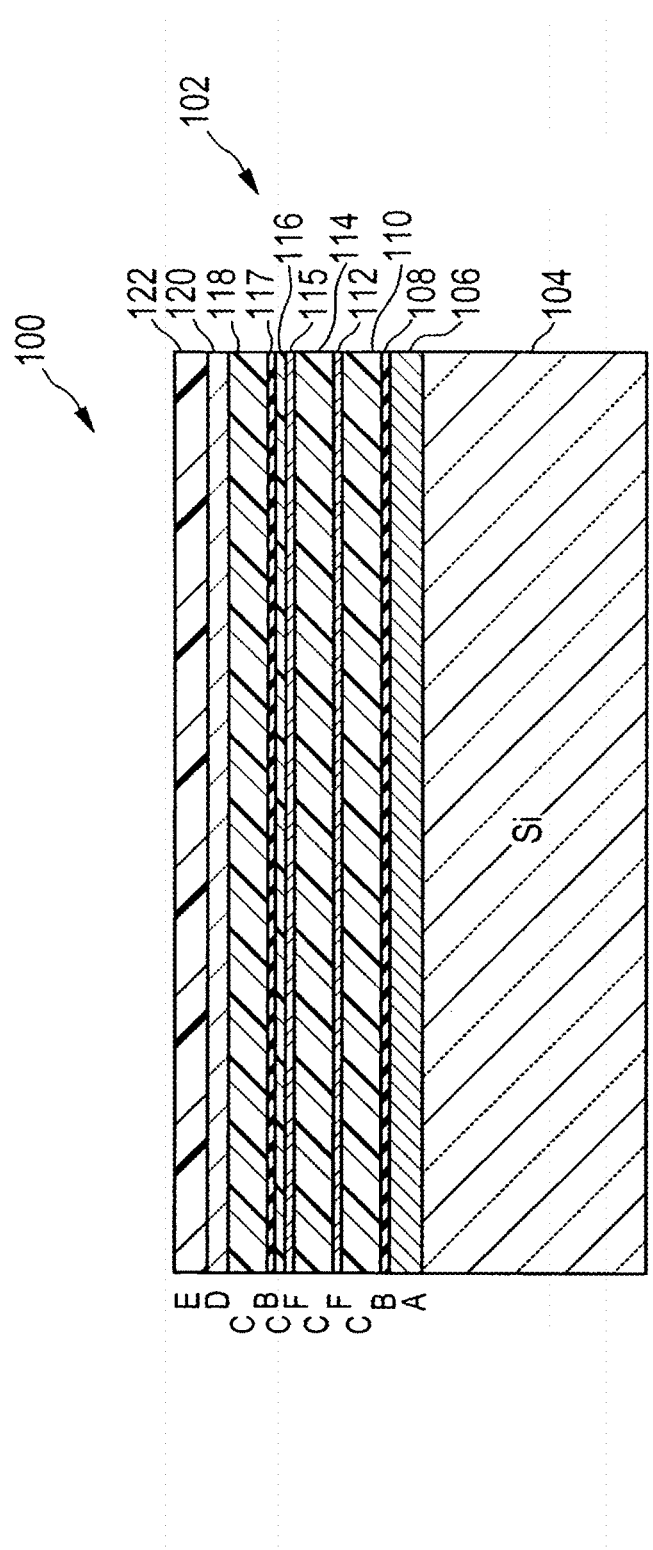
FIG. 1 shows an embodiment of a nitride semiconductor product that forms an intermediate product in the production of a nitride semiconductor component according to the invention.
Figure 6C:
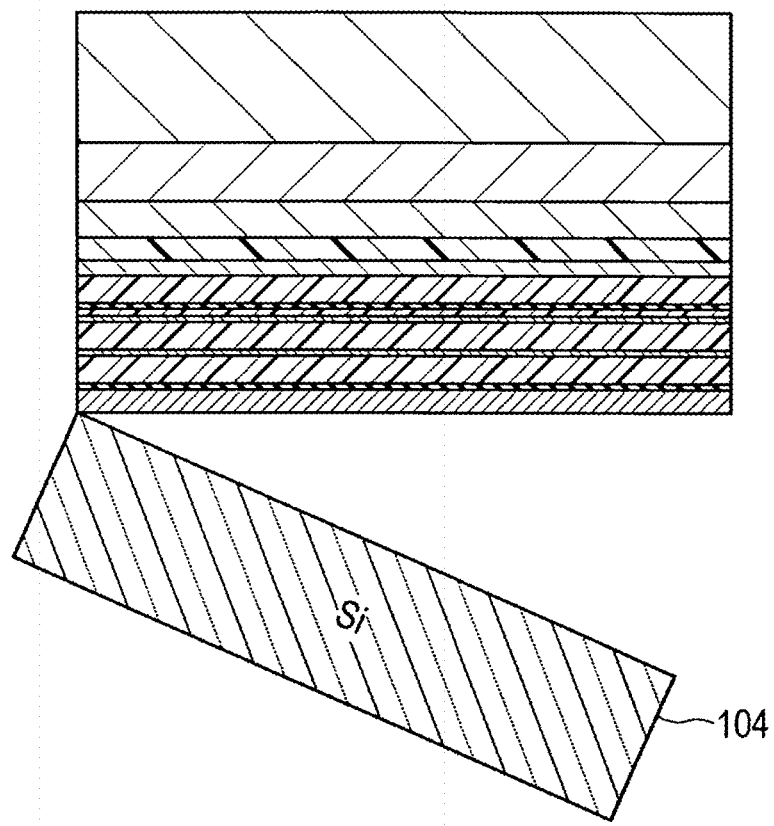
FIG. 6a)-6f) show different process stages in the production of an LED from the nitride semiconductor product of FIG. 1.
Figure 6E:
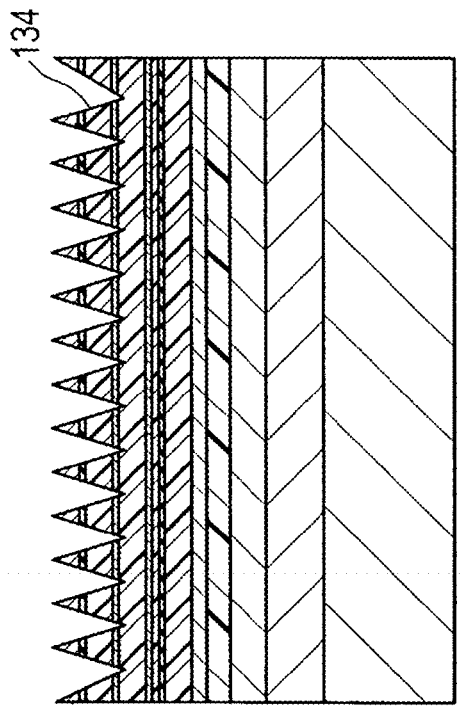

FIG. 1 shows in a diagrammatic view the layer structure of a nitride semiconductor product 100. The nitride semiconductor product 100 forms an intermediate product in the production of a nitride semiconductor component, as is explained in more detail hereinbelow with the aid of FIGS. 6a)-6f).

The illustration in FIG. 1 is not true to scale. In particular, the exact ratio of the layer thicknesses of the individual illustrated layers to one another cannot be determined from the figure. The layer thickness relationships shown in the figure thus provide only a fairly rough starting point. In the following description process aspects are discussed in parallel to device aspects on account of the lack of detail of the illustration.

The nitride semiconductor product 100 contains a layer structure 102 on a silicon wafer 104. The employed growth surface of the wafer, which is perpendicular to the plane of the paper of FIG. 1, is a (111) silicon surface. Instead of a silicon wafer there may also be used an SOI substrate or some other suitable substrate, preferably with a (111) silicon surface.

To identify the layers, for the sake of clarity in addition to the reference numerals 106 to 122 letters A to F are also shown on the left-hand side of FIG. 1 next to the individual layers. In this connection the same letters characterise layers of the same type. In particular A is a nitride nucleation layer in combination with a buffer layer, B is a masking layer, C are nitride semiconductor layers, here in particular n-conducting GaN layers, D is a multi-quantum-well structure, E is a p-doped nitride semiconductor cover layer, here in particular p-GaN, and F is a low-temperature AlN or AlGaN intermediate layer for the strain engineering.

Further details of the layer structure and its production are described hereinafter. Before layers are deposited the growth of the wafer 104 is passivated. This means that it is deoxidised either by wet chemical treatment or by heating in vacuo or in hydrogen at temperatures above 1000° C., and a hydrogen-terminated surface is produced.

The nucleation layer 106 has a thickness of between 10 and 50 nm. A layer thickness of at most 400 nm is formed in the composite, which in the present example has a buffer layer deposited thereon, though in the process procedure the buffer layer is in principle optional.

An AlN nucleation layer is suitable, which is grown either at low temperatures, i.e. below 1000° C., for example at 600-800° C., or at high temperatures, i.e. normal growth temperatures for AlN above 1000° C. The optional buffer layer is preferably also of AlN and is applied at high growth temperatures. The buffer layer may however also consist of AlGaN. When using AlGaN the nucleation layer may also have a relatively large thickness, for example ca. 600 nm.

When growing the nucleation layer it is expedient to begin the addition of the aluminium precursor to the reactor before the addition of the nitrogen precursor, in order thereby to prevent a nitriding of the substrate. A nitriding of the substrate may lead to an undesired polycrystalline growth of AlN.

A masking layer of silicon nitride is deposited on the composite consisting of the nucleation layer and buffer layer 106. This deposition is carried out by simultaneously introducing a silicon precursor such as for example silane or disilane or an organic silicon compound, and a nitrogen precursor such as ammonia or dimethylhydrazine. The two precursors react on the growth surface to form silicon nitride.

The thickness of the SiN masking layer is chosen so that during the following growth of the first nitride semiconductor layer 110, in a reflectometry measurement carried out at the same time at a wavelength of 630 nm, the full oscillation strength is obtained only after more than four oscillations. This corresponds to a layer thickness of ca. 600 nm. In general this leads to a surface with an only slight hole density, i.e. regions still not planarised between the original islands, of <5%, which cannot as a rule be resolved by reflectometry. A suitable SiN layer thickness can be determined subject to this stipulation by simple experiments. A transfer of this technical teaching to other wavelengths used in reflectometry does not present any problem to the person skilled in the art.

During the growth of the first nitride semiconductor layer 110, which in the present example of FIG. 1 basically consists of GaN and is therefore also termed GaN layer 110, no coalescence-promoting growth parameters are adjusted in the present embodiment. This means that the temperature and the ratio of nitrogen precursor to gallium precursor are not increased. Using such parameters a sufficiently compressive growth of the GaN layer 110 and with it a far smaller tensile stress after cooling and thus a substantially less curved and homogeneous destressed component structure are obtained.

The aforementioned growth conditions lead to a larger island growth, which in turn improves the layer quality and also exhibits a lower tendency to crack formation.

The layer thickness of the GaN layer 110 is between 800 and 1600 nm. An aluminium-containing nitride semiconductor intermediate layer in the form of a low-temperature AlN intermediate layer 112 is deposited on this for the strain engineering. The low temperature AlN intermediate layer has in this case a thickness of 8 to 15 nm.

The low temperature AlN intermediate layer increases the compressive stress component. If this layer were omitted, a GaN layer 1300 nm thick could be grown crack-free on account of the SiN masking layer 108, since on cooling the tensile stress component would in this case cause cracks above this thickness.

The insertion of the low temperature AlN intermediate layer 112 thus enables a greater overall layer thickness of the GaN layer to be achieved by continued growth of a sequence of further GaN layers and low temperature AlN intermediate layers. The low temperature AlN intermediate layer 112 consequently follows a second GaN layer 114, again ca. 800 to 1600 nm thick, which is in turn followed by a further low temperature AlN intermediate layer 115. A third GaN layer 116 is deposited on this. A second masking layer 117 of SiN is in turn deposited on this third layer. The second SiN masking layer 117 leads to a reduction of the dislocation concentration in the following fourth GaN layer 118.

The four GaN layers 110, 114, 116 and 118 are n-doped. The doping is carried out during the growth by adding a suitable doping substance precursor.

The process procedure described so far thus already leads in the first GaN layer 110, which corresponds to the first nitride semiconductor layer of the description given above, to a growth with compressive stress. The reduced tensile stress that can be achieved in this way facilitates the subsequent removal and bonding of the wafer 104 to a carrier. The forces acting on the adhesive are less. The overall layer structure 102 accordingly adheres more easily to the carrier. The improved crystallite structure and the reduced tensile stress already in the first GaN layer 110 moreover reduce the tendency to crack formation during and after the stripping of the layer structure 102.

A multi-quantum-well structure is deposited on the fourth GaN layer 118. The choice of material and exact layer structure of this multi-quantum-well structure 120 are adjusted corresponding to the desired wavelength of the light emission. The parameters to be adjusted for this purpose, such as the layer stoichiometry and layer thickness, are known to the person skilled in the art. As is generally known, by adding indium the band gap of a nitride semiconductor, for example starting from pure GaN, is reduced in the direction of the band gap of indium nitride. By adding aluminium the band gap is increased towards the value of AlN. In this way a light emission can be adjusted having a desired wavelength that lies between the red and the ultraviolet regions of the spectrum.

An injection barrier for example 10 to 30 nm thick may optionally be provided on the multi-quantum-well structure 120, though this is not illustrated in FIG. 1.

Instead, a cover layer 122 of p-GaN directly adjoining the multi-quantum-well structure 120 is illustrated.

The above description related to an embodiment of a nitride semiconductor component according to the invention. It is understood of course that with another component, such as for example a field effect transistor, the specific details of the layer structure and the layer doping have to be adjusted in a manner known per se.

Figure 2:
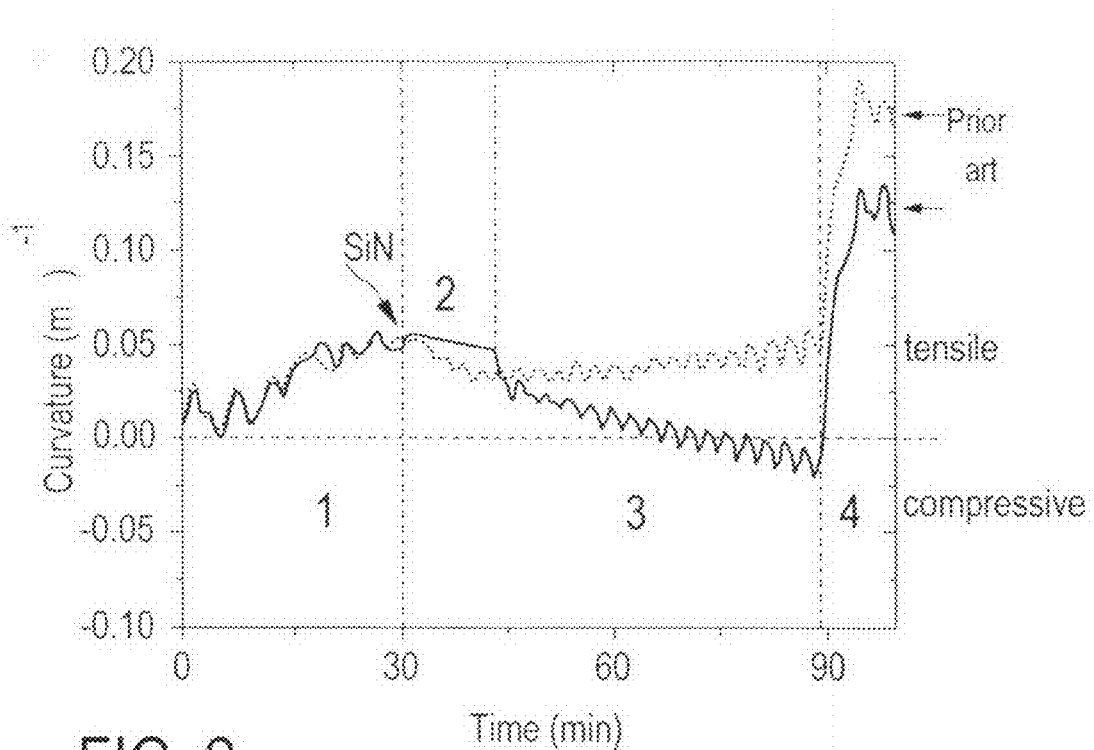
FIG. 2 is a diagram that shows the development of the radius of curvature of the semiconductor product of FIG. 1 during its production, and also compared to the radius of curvature of a nitride semiconductor product according to the prior art during its production.

FIG. 2 shows a diagram that illustrates the development of the curvature of a nitride semiconductor product during its production by the process according to the invention and also, in comparison, the curvature of a nitride semiconductor product according to the prior art during its production. The time in minutes is plotted on the x-axis of the diagram, the time lasting between the beginning of the layer deposition on a (111) silicon substrate and the end of the cooling of the grown layer structure. The curvature, i.e. the reciprocal of the radius of curvature of the nitride semiconductor product, is plotted on the y-axis. The measurement of the curvature is possible with a high degree of precision using modern measurement methods. Details of the measurement of the curvature can be obtained from the publications by A. Krost et al., phys. stat. sol. (b) 242, 2570-2574 (2005) and A. Krost et al., phys. stat. sol. (a) 200, 26-35 (2003). The values of the curvature between −0.2 and 0.2 plotted on the y-axis correspond to curvatures with a radius of curvature between 5 m and infinity.

Two different measurement curves are plotted on the diagram of FIG. 2. A measurement curve of the curvature during the growth of the conventional nitride semiconductor according to the prior art is shown by the dotted line. The time progression of the curvature of the nitride semiconductor product according to the invention is shown by the continuous line.

Four different growth phases can be distinguished in the process procedure according to the invention, which are separated from one another by vertical dotted lines in FIG. 2. The time intervals thereby defined are identified by Arabic numerals 1 to 4. The growth of the AlN nucleation layer 106 as well as the heating up to a growth temperature above 1000° C. suitable for the deposition of GaN takes place in a time interval 1. Starting from an initially vanishing curvature (corresponding to an infinite radius of curvature), a slight positive curvature is established in this time interval in both different structures. In the following time interval 2, which starts just after 30 minutes and lasts about 45 minutes after the start of the growth, the SiN masking layer (108 in the Example of FIG. 1) and the first GaN layer (110 in FIG. 1) are grown. The start of the coalescence of the GaN growth islands occurs in this time interval. It can clearly be seen that the curvature of the layer structure produced by the process according to the invention assumes in this stage higher values than in the comparison structure, which is grown by a conventional process without using a SiN masking layer.

The first GaN layer (110 in FIG. 1) is grown in a following time interval 3. In the comparison sample according to the conventional process procedure the procedure differs here on account of the absence of intermediate layers, and the time interval 3 lasts between 30 and slightly over 80 minutes after the start of the growth. In the present case no low temperature AlN growth phase is introduced for the production of the AlN intermediate layer 112.

Both structures are cooled after completion of the layer deposition (time interval 4). In the comparison sample produced according to the prior art, as in the case of the sample produced according to the invention, the cooling takes place about 90 minutes after the start of the process and leads in the comparison sample to a relatively marked curvature of the sample of about 0.17 m$^{-1}$, which corresponds to a radius of curvature of about 5.8 m. In the layer structure produced according to the invention the curvature after completion of the cooling process is about 0.12 m$^{-1}$, corresponding to a radius of curvature of about 8.3 m. This value can be further optimised by inserting further low temperature AlN layers, as in the layer structure of FIG. 1, so that a nitride semiconductor product with vanishingly small curvature can be produced.

Figure 3:
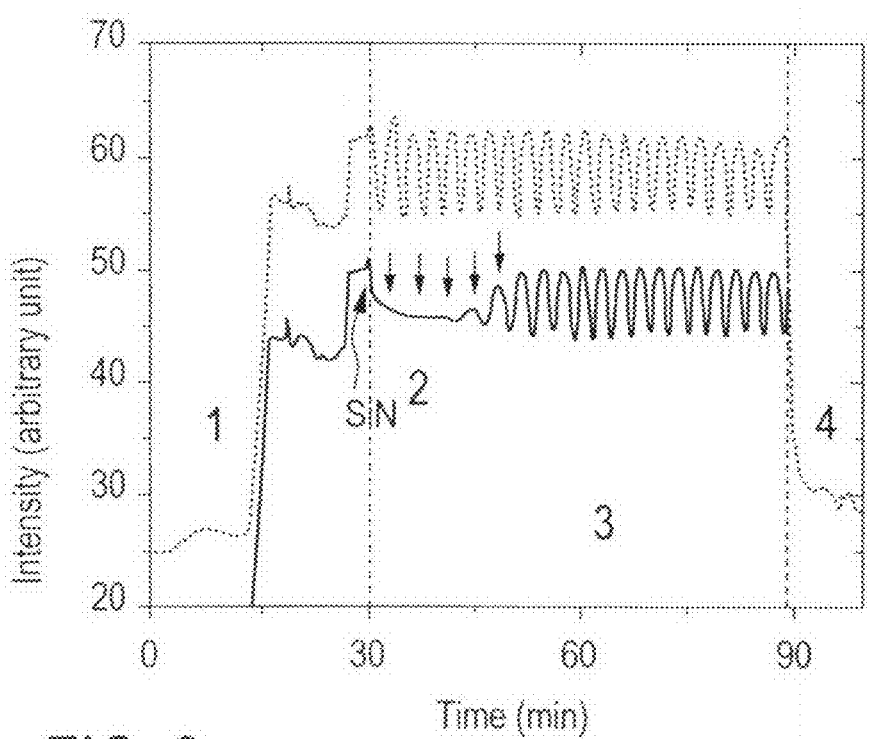
FIG. 3 is a diagram showing the development over time of the light reflected from the growth surface of the nitride semiconductor product during its production.

FIG. 3 is a diagram showing the development over time of the light reflected from the growth surface of the nitride semiconductor product during its production, during the process procedure for the comparison sample (dotted curve) described on the basis of FIG. 2, and for the sample produced according to the invention. The diagram thus shows the result of a reflectometry measurement at a light wavelength of ca. 600 nm during the growth of the layer structure corresponding to the process procedure explained in FIG. 2. The reflected light intensity is plotted against time. The diagram is subdivided in the same way as in FIG. 2, into time sections 1, 2, 3 and 4. Initial intensity maxima of the reflected light intensity, which as is generally known oscillates during the layer growth, are identified by arrows in section 2. It can be seen that, in contrast to the comparison sample, in the sample produced according to the invention the full range between intensity minima and maxima is reached after 5 to 6 oscillations. If the duration of the growth of the masking layer is adjusted so that such a pattern occurs in the reflectometry measurement, then it is found by experience that initially separate crystallites are present in the deposition step of the GaN layer, which grow together above a coalescence layer thickness and occupy an average surface area of at least 0.16 μm$^2$ to 0.36 μm$^2$ in a layer plane of the intergrowing nitride semiconductor layer perpendicular to the direction of growth. It is to be expected that even larger average surface areas can be achieved by optimising still further the growth parameters.

Figure 4A:
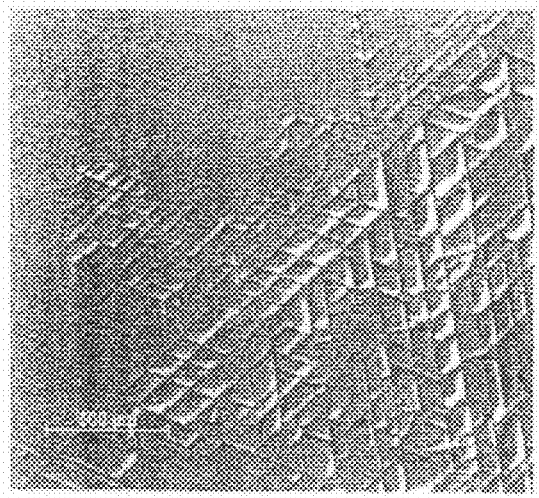
FIG. 4a) and b) are difference interference contrast microscope (DIC) images of GaN layers that have been produced by the process according to the prior art.
Figure 4B:
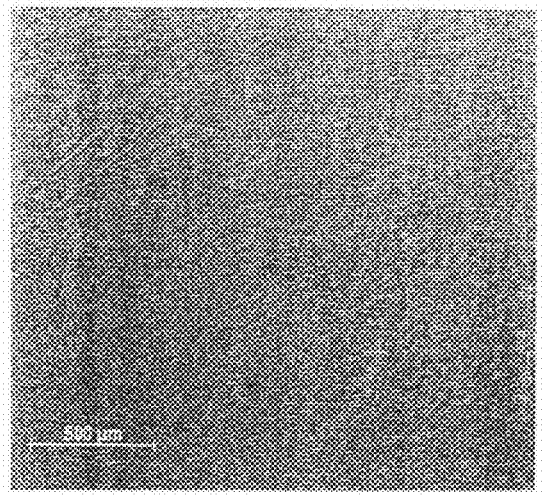
FIG. 4c) is a DIC image of a GaN layer that has been produced by a process according to the invention.
Figure 4C:
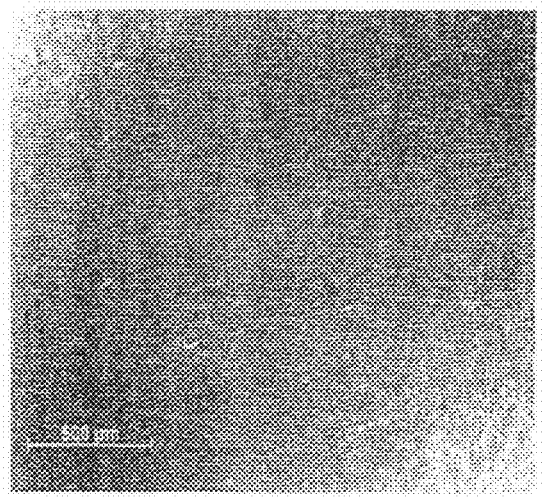

FIGS. 4a) and b) show difference interference contrast microscope (DIC) images of GaN layers that have been produced by processes according to the prior art. FIG. 4c) shows a DIC image of a GaN layer that has been produced by a process according to the prior art.

The scanning electron microscope images of FIGS. 4a) to 4c) show surfaces, represented on the same scale, of variously produced GaN layers. The sample shown in FIG. 4a) was produced without a SiN masking layer and has a thickness of about 2.5 µm. It can clearly be seen that the surface has a large number of cracks. The surface shown in FIG. 4b) belongs to a sample 2.4 µm thick which, although it was produced using a SiN masking layer, did not however include an AlN intermediate layer for the strain engineering. This layer shows a significantly improved structure with only a few cracks, compared to the previously discussed sample.

The surface of a sample illustrated in FIG. 4c), which was grown up to a thickness of 2.8 µm according to the invention, i.e. using a suitable SiN masking layer and with low temperature AlN intermediate layers, exhibits on the other hand a greatly improved quality without any crack formation in the imaged section.

Figure 5A:
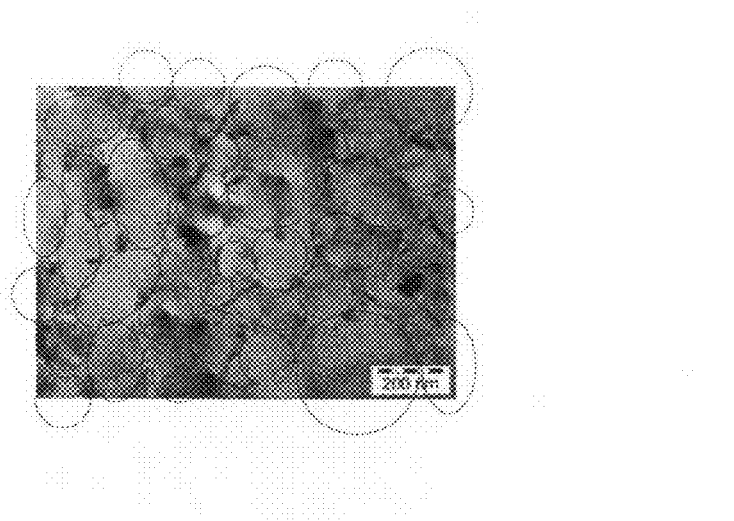
FIG. 5a) is an in-plane transmission electron microscope image of a GaN layer that has been produced by a process according to the prior art.
Figure 5B:
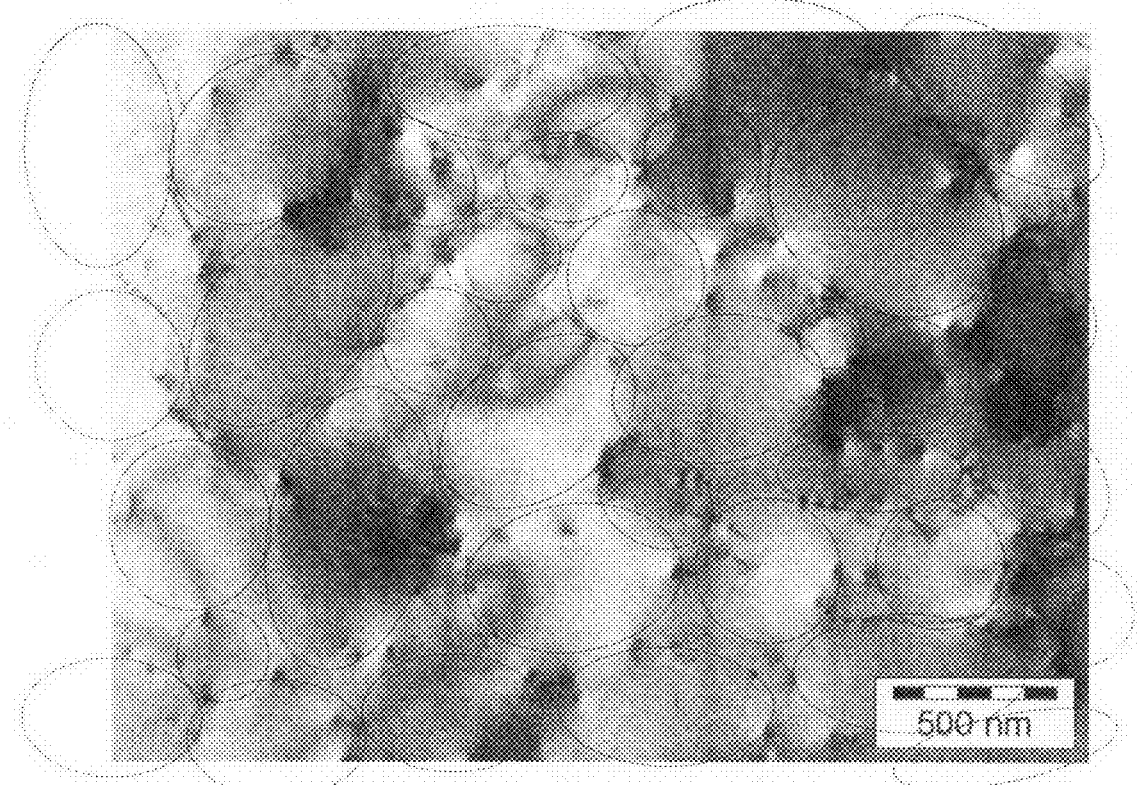
FIG. 5b) is an in-plane transmission electron microscope image of a GaN layer that has been produced by a process according to the invention.

FIG. 5a) shows an in-plane transmission electron microscope image of a GaN layer that was produced by a process according to the prior art. FIG. 5b) shows an in-plane transmission electron microscope image of a GaN layer that was produced by a process according to the invention. The images show on roughly the same scale variously grown GaN layers. No SiN masking layer was used when growing the layer shown in FIG. 5a). The process sequence according to the invention was however adopted when growing the layer shown in FIG. 5b).

In order to evaluate the images the size of the crystallites visible in the illustrated layer plane was estimated, and for this purpose circular or elliptical rings that roughly follow the recognisable contours of the coalesced crystallites were superimposed on the image.

By way of explanation it should be added that dislocations in the heteroepitaxy occur on the one hand as misfit dislocations at the interface and on the other hand are formed by the generally occurring island growth. When islands adapt strongly to imperfections in crystallite structures they always grow slightly tilted or twisted. At the same time the tilting at the interface of two crystallites leads to the formation of screw dislocations. Twisting leads to the formation of edge dislocations at the interface of two crystallites. These dislocations accordingly are formed at the boundary of two crystallites precisely due to the coalescence process that occurs with increasing layer thickness. Only a few dislocations take place independently of these effects, for instance directly at the interface with the substrate. The recognisable edge dislocations and screw dislocations accordingly indicate approximately the boundary of the coalescing crystallites since, provided that the adjacent crystallite is only slightly imperfectly oriented, these dislocations "decorate" the coalescing crystallites. In order to check the average surface area of the crystallites, a layer plane at a distance of 700±50 nm from the masking layer should be used.

An average surface area occupied by the crystallites in the illustrated plane of intersection was calculated from the ratio of the illustrated surface area and the number of the thus identified crystallites. In both investigated samples this plane of intersection lies above the coalescence layer thickness. In the sample illustrated in FIG. 5a) 38 crystallites were counted on an area of 894 nm×1195 nm=1.0681 µm². This gives an average surface area of 0.0281 µm² per crystallite.

In the sample of a nitride semiconductor product according to the invention illustrated in FIG. 5b) on the other hand, 35 crystallites were counted on a surface area of 2982 nm×2238 nm=6.67 µm². This gives an average surface area of 0.19 µm² per crystallite.

It should be pointed out that the investigated sample of FIG. 5b) lies, as regards its quality, at the lower limit of the values that can be achieved with the process according to the invention. Preferably the process procedure is carried out so that the average surface area is at least 0.36 µm². In this way the compressive stress in the GaN layer can be significantly increased, which leads to better results for the radius of curvature and tensile stress in the finished component.

FIGS. 6a)-6f) show different process stages in the production of an LED from the nitride semiconductor of FIG. 1. The process procedure described here follows after the production of the nitride semiconductor component of FIG. 1.

In this connection an upper side metallisation is first of all provided on the nitride semiconductor product 100. This serves on the one hand for the subsequent bonding to a carrier 126, and on the other hand to improve the light decoupling from the component that is formed.

The carrier 126 is fabricated from copper or AlSi and is metallised 130 on one side 128 that is used for the bonding. FIG. 6b) shows a process stage after the bonding. The bonding is carried out at a temperature of 280° C. The use of such a low temperature has the advantage that no additional stresses are produced by the thermal cycle during the bonding.

Figure 6D:
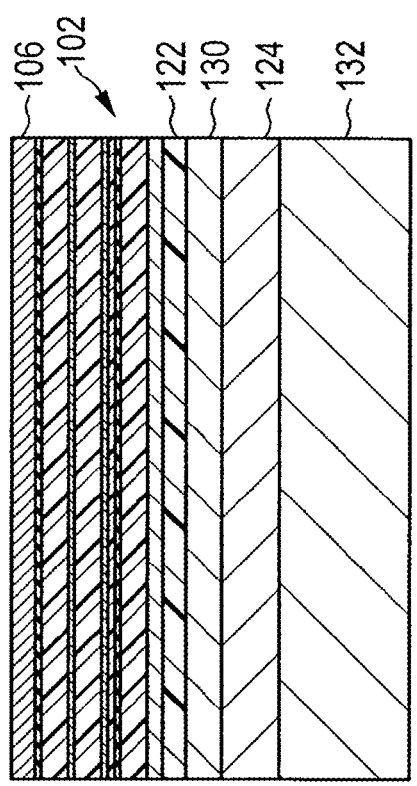

The Si wafer 104 is removed in a following step. This is illustrated diagrammatically in FIG. 6c). The Si wafer 104 is removed by means of grinding and etching. The etching may be wet-chemical or dry-chemical etching. The structure illustrated in FIG. 6d) is thereby produced, in which the nucleation layer 106 formerly bonded to the Si wafer now forms the upper side and the p-cover layer 122 is in direct contact with the metallisation 124/130. In a following step the upper side is structured by etching. Pyramidal structures that improve the light decoupling from the component are formed by the etching, for example with KOH or $H_3PO_4$. Finally, contact structures are produced. To define the flow polarity of the LED a negative polarity is applied to the pole-end contact 136 on the surface and a positive polarity is applied to the pole-end contact on the carrier.

Figure 7:
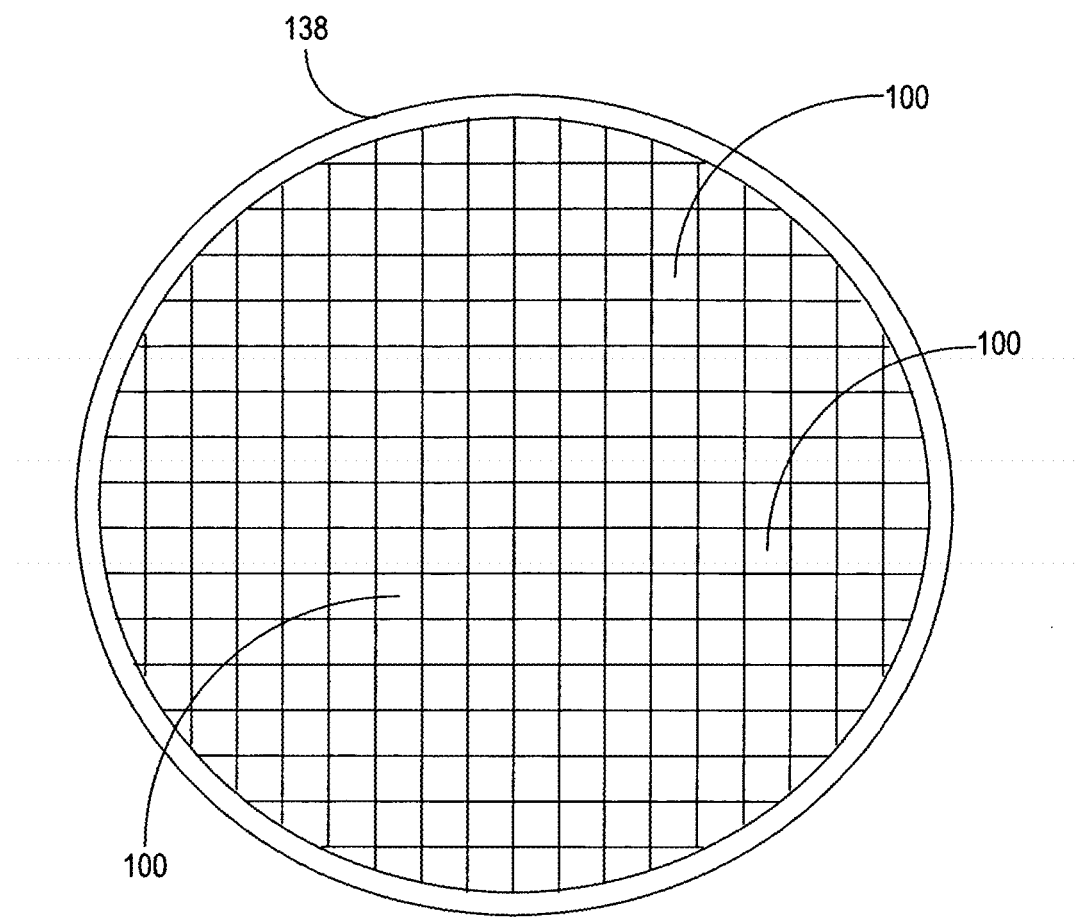
FIG. 7) shows an embodiment of a carrier wafer with a plurality of nitride semiconductor components according to the invention.

FIG. 7 shows a carrier wafer 138 having a plurality of nitride semiconductor components 100. The plurality of nitride semiconductor components on the carrier wafer may have in totality a lateral dimension of at least 24 cm.

According to the invention layer growth is possible on large substrates and thus enables either the production of large components or a cost-efficient production of a large number of smaller components. The described process procedure takes place without the laser stripping that is conventionally employed in the use of sapphire substrates, and is therefore simpler and cheaper. Photolithography procedures are simply necessary for the production of the rear side contact and for a structuring before the separation of the components.

The preceding description shows that, based on the growth process according to the invention for an unstressed nitride semiconductor layer structure, a particularly simple processing is possible in the further production stages of the component. Qualitatively high-grade but inexpensive components can be produced in this way.

Different variants are possible in the process procedure. For example, the p-conducting cover layer 122 can, after at least 20 nm growth of p-GaN, be provided with a SiN mask.

Figure 6F:
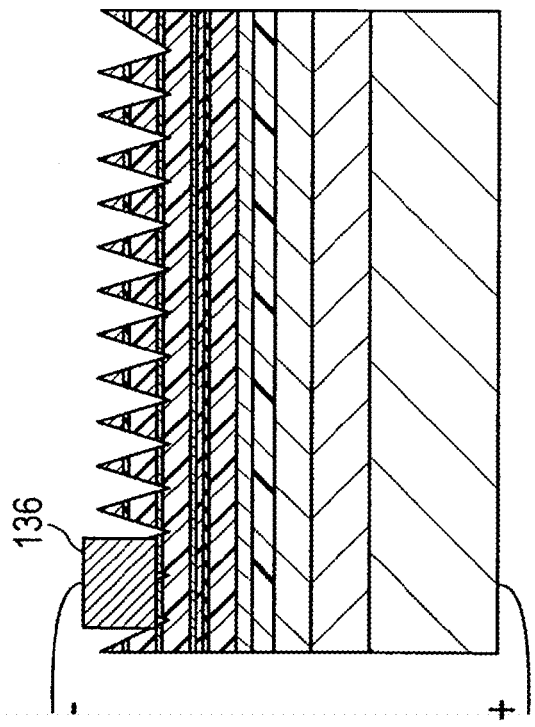

The subsequent further growth of p-GaN takes place in an insular manner and does not lead to complete coalescence. This produces a rough surface and leads in the finished semiconductor component of FIG. 6f) to a more homogeneous light emission upwardly. The light is decoupled more effectively, even if a less efficient anti-reflection layer is applied to the upper side.

The invention claimed is:

1. A nitride semiconductor component comprising:
a substrate with a silicon surface,
an aluminum-containing nitride nucleation layer on the silicon surface of the substrate,
an aluminum-containing nitride buffer layer on the aluminum-containing nitride nucleation layer,
a masking layer of silicon nitride on the aluminium-containing nitride buffer layer,
a gallium-containing first nitride semiconductor layer on the masking layer of silicon nitride, the gallium-containing first nitride semiconductor layer having a structure of coalesced crystallite growth islands, wherein starting at a distance of at least 600 nm from the masking layer of silicon nitride the gallium-containing first nitride semiconductor layer is at least 80% closed,
wherein layer planes above the distance of at least 600 nm from the masking layer of silicon nitride exhibit an average surface area per crystallite growth island of at least 0.16 µm², and adjoining the gallium-containing first nitride semiconductor layer is a layer sequence formed by an aluminum-containing nitride intermediate layer that has a thickness range of 8 nanometers to 15 nanometers, and
a gallium-containing second nitride semiconductor layer on the aluminum-containing nitride intermediate layer.

2. The nitride semiconductor component according to claim 1, in which the crystallite growth islands in the layer planes above the distance of at least 600 nm from the masking layer of silicon nitride have an average size of at least 400× 400 nm² per crystallite.

3. The nitride semiconductor component according to claim 1, in which the gallium-containing first nitride semiconductor layer has a layer thickness of between 800 nm and 1600 nm.

4. The nitride semiconductor component according to claim 1, that repeatedly contains said layer sequence.

5. The nitride semiconductor component according to claim 4, wherein said layer sequence repeats N times and in which a multi-quantum-well structure of nitride semiconductor material is deposited on a third nitride semiconductor layer over the Nth layer sequence, where N is a positive integer.

6. The nitride semiconductor component according to claim 5, wherein another masking layer of silicon nitride is deposited immediately before a deposition of the third nitride semiconductor layer.

7. The nitride semiconductor component according to claim 6, wherein the gallium-containing first nitride semiconductor layer, and the gallium-containing second nitride semiconductor layers of said N layer sequences that are arranged on a side of the multi-quantum-well structure, which side faces towards the gallium-containing first nitride semiconductor layer, are n-doped.

8. The nitride semiconductor component according to claim 5, with a p-doped, gallium-containing nitride semiconductor cover layer that is arranged on a side of the multi-quantum-well structure facing away from the gallium-containing first nitride semiconductor layer.

9. The nitride semiconductor component according to claim 1, with a carrier that is bonded to the gallium-containing second nitride semiconductor layer.

10. The nitride semiconductor component according to claim 9, in which the carrier and the gallium-containing second nitride semiconductor layer are bonded to one another via a metal layer.

11. The nitride semiconductor component according to claim 9, in which the carrier comprises primarily copper, aluminium, silicon or aluminum nitride or Al/Si.

12. The nitride semiconductor component according to claim 9, in which an electrically conducting contact layer is arranged between the carrier and the gallium-containing second nitride semiconductor layer.

13. The nitride semiconductor component according to claim 12, in which the contact layer has a higher refractive index than a p-doped gallium-containing nitride semiconductor cover layer.

14. The nitride semiconductor component according to claim 8, in which the p-doped, gallium-containing nitride semiconductor cover layer is deposited in a thickness of $$m \cdot \frac{\lambda}{2 \cdot n_{nitride}} + \frac{\lambda}{4 \cdot n_{nitride}} - \frac{d_{MQW}}{2},$$

where m=0, 1, 2, 3, . . . ; λ is a wavelength of a light emission of the multi-quantum-well structure during operation of the nitride semiconductor component, $n_{nitride}$ is a refractive index of a nitride semiconductor material, which forms the p-doped, gallium-containing nitride semiconductor cover layer at the wavelength λ, and $d_{MQW}$ denotes a thickness of the multi-quantum-well structure.

15. Nitride semiconductor component according to claim 12, in which the contact layer has a lower refractive index than the p-doped nitride semiconductor cover layer.

16. Nitride semiconductor component according to claim 15, in which the nitride semiconductor cover layer of the layer structure is deposited in a thickness of $$m \cdot \frac{\lambda}{2 \cdot n_{nitride}} - \frac{d_{MQW}}{2},$$

where m=1, 2, 3, 4, . . . ; λ is a wavelength of a light emission of the multi-quantum-well structure during operation of the nitride semiconductor component, $n_{nitride}$ is the refractive index of the nitride at the wavelength λ, and $d_{MQW}$ denotes the thickness of the multi-quantum-well structure.

17. The nitride semiconductor component according to claim 1, with an n-side and a p-side electrical contact element.

18. The nitride semiconductor component according to claim 1, wherein the gallium-containing second nitride semiconductor layer has a thickness in the range of 800 nanometers to 1600 nanometers.

19. A carrier wafer with a plurality of nitride semiconductor components, each nitride semiconductor component comprising respectively:
a substrate with a silicon surface,
an aluminum-containing nitride nucleation layer on the silicon surface of the substrate,
an aluminum-containing nitride buffer layer on the aluminum-containing nitride nucleation layer,
a masking layer of silicon nitride on the aluminum-containing nitride buffer layer, a gallium-containing first nitride semiconductor layer on the masking layer of silicon nitride, the gallium-containing first nitride semiconductor layer having a structure of coalesced crystallite growth islands, wherein starting at a distance of at least 600 nm from the masking layer of silicon nitride the gallium-containing first nitride semiconductor layer is at least 80% closed, wherein layer planes above the distance of at least 600 nm from the masking layer of silicon nitride exhibit an average surface area per crystallite growth island of at least 0.16 $\mu m^2$, and adjoining the gallium-containing first nitride semiconductor layer is a layer sequence formed by an aluminum-containing nitride intermediate layer that has a thickness range of 8 nanometers to 15 nanometers, and a gallium-containing second nitride semiconductor layer on the aluminum-containing nitride intermediate layer.

20. The carrier wafer according to claim 19, in which the plurality of nitride semiconductor components on the carrier have in totality a lateral dimension of at least 24 cm.

* * * * *